United States Patent [19]

Tokuda et al.

[11] Patent Number: 5,384,533

[45] Date of Patent: Jan. 24, 1995

[54] TESTING METHOD, TESTING CIRCUIT AND SEMICONDUCTOR INTEGRATED CIRCUIT HAVING TESTING CIRCUIT

[75] Inventors: Hideo Tokuda; Tetsu Tanizawa, both of Kawasaki, Japan

[73] Assignee: Fujitsu Limited, Kawasaki, Japan

[21] Appl. No.: 59,415

[22] Filed: May 11, 1993

Related U.S. Application Data

[63] Continuation of Ser. No. 845,354, Mar. 5, 1992, abandoned, which is a continuation of Ser. No. 525,059, May 18, 1990, abandoned.

[30] Foreign Application Priority Data

May 19, 1989 [JP] Japan .................. 1-127401

[51] Int. Cl.$^6$ .......................................... G01R 31/28
[52] U.S. Cl. .................. 324/158.1; 371/22.1; 371/25.1
[58] Field of Search ............ 324/158 R, 73.1, 158.1; 371/15.1, 16.1, 22.1, 22.3, 22.6, 25.1; 307/301.1; 437/8

[56] References Cited

U.S. PATENT DOCUMENTS

| | | | |
|---|---|---|---|
| 4,244,048 | 1/1981 | Isui | 371/22.3 |
| 4,340,857 | 7/1982 | Fasong | 371/22.5 |
| 4,404,519 | 9/1983 | Westcott | 324/73.1 |
| 4,459,693 | 7/1984 | Prang et al. | 324/73.1 |
| 4,660,198 | 4/1987 | Lyon | 371/22.5 |
| 4,710,931 | 12/1987 | Bellay et al. | 371/22.3 |
| 4,710,933 | 12/1987 | Powell et al. | 371/22.3 |
| 4,764,926 | 8/1988 | Knight et al. | 371/22.3 |
| 4,780,666 | 10/1988 | Sakashita et al. | 324/158 R |
| 4,799,004 | 1/1989 | Mori | 371/25.1 |
| 4,864,579 | 9/1989 | Kashita et al. | 371/25.1 |
| 4,872,169 | 10/1989 | Whetsel, Jr. | 371/22.3 |
| 4,910,735 | 3/1990 | Yamashita | 371/22.4 |
| 4,913,557 | 4/1990 | Segawa et al. | 371/22.3 |
| 4,931,722 | 6/1990 | Stoica | 371/22.5 |
| 4,949,033 | 8/1990 | Kono et al. | 324/158 R |
| 4,974,226 | 11/1990 | Fujimori et al. | 371/22.6 |
| 4,995,039 | 2/1991 | Sakashita et al. | 371/22.3 |
| 5,070,296 | 12/1991 | Priebe | 324/73.1 |
| 5,248,937 | 9/1993 | Hölze | 324/158 R |

FOREIGN PATENT DOCUMENTS

| | | |
|---|---|---|
| 53665 | 6/1982 | European Pat. Off. . |
| 273821 | 7/1988 | European Pat. Off. . |
| 3832113 | 4/1989 | Germany . |
| 3832440 | 4/1989 | Germany . |
| 150441 | of 1984 | Japan . |

*Primary Examiner*—Vinh Nguyen
*Attorney, Agent, or Firm*—Staas & Halsey

[57] ABSTRACT

A testing method tests functions of a semiconductor integrated circuit which has a plurality of blocks each having a main block circuit part and an output part. The testing method comprises the steps of supplying a control signal to the output part of each of the blocks in a normal mode so that each output part outputs an output data of the main block circuit part of a corresponding one of the blocks, supplying the control signal and a test data to the output part of each of the blocks in a test mode so that each output part outputs the test data which is supplied to the main block circuit part of another block, and comparing the output data and the test data in the output part of each of the blocks in the test mode and outputting a failure detection signal which is indicative of a failure in a corresponding one of the blocks when the compared output data and test data do not match in the one block.

19 Claims, 10 Drawing Sheets ns between the blocks, and this leads to a further decrease in the integration density.

FIG. 1 schematically shows the interconnections between the blocks when the first method is employed. In FIG. 1, a semiconductor integrated circuit includes a block $100_i$ having an input part $101_i$ and an output part $102_i$, where i=1, 2 and 3 in this case. A group of interconnections made up of an address line, a clock signal line and the like for the latch circuits forms a test bus 104. As may be seen from FIG. 1, the test bus 104 is connected to both the input part $101_i$ and the output part $102_i$ of each block $100_i$ and the number of interconnections is extremely large. FIG. 1 also shows an input terminal group 106 and an output terminal group 107.

On the other hand, when the second method described above is employed to write and read out the test data, it takes a long time to write and read out the test data as the number of flip-flops becomes large. As a result, the test time becomes long and the efficiency of the test process becomes poor.

TESTING METHOD, TESTING CIRCUIT AND SEMICONDUCTOR INTEGRATED CIRCUIT HAVING TESTING CIRCUIT

This application is a continuation of application Ser. No. 07/525,059, filed May 18, 1990, now abandoned. This application is a continuation of U.S. patent application Ser. No. 07/845,354, filed Mar. 5, 1992, now abandoned.

BACKGROUND OF THE INVENTION

The present invention generally relates to testing methods, testing circuits and semiconductor integrated circuits having a testing circuit, and more particularly to a testing method, a testing circuit and a semiconductor integrated circuit having the testing circuit for testing blocks of the semiconductor integrated circuit.

Recently, there are demands to develop a standard-cell LSI in which blocks having the functions of the conventional LSI chips are integrated, so as to provide systems such as computers on chips. Similarly to the conventional system design in which the LSI is often treated as a black box, the block is often treated as a black box when the user makes the circuit design of the standard-cell LSI. For this reason, the manufacturer of the standard-cell LSI must test each of the blocks to guarantee the functions of the blocks. However, it is difficult to make direct access to the blocks from the external signal pins of the LSI because the number of signal pins on the LSI is limited. Hence, there is a demand to provide a means within the LSI that would enable testing of each block.

In the conventional LSI chip, when testing a part of the LSI to which a direct access cannot be made from the external signal pin of the LSI, flip-flops or the like are used to read and write the test data.

When using the flip-flops to test each block, the flip-flops are connected to input and output terminals of each block, for example. The flip-flops connected to the input terminals are used for writing the test data, and the flip-flops connected to the output terminals are used for reading the test data.

As methods of writing and reading the test data, there basically are two methods. According to a first method, scan-in and scan-out functions are provided in each latch circuit and the test data is selectively written and read out based on the scan address. On the other hand, according to a second method, a shift register is formed by connecting the flip-flops in series and the test data is written and read out by a shift operation of the shift register.

According to the conventional testing method, the latch circuits or flip-flops are provided at the input and output terminals of each block. By the provision of the latch circuits or flip-flops, the scale of the circuit of each block becomes large. As a result, there are problems in that the area occupied by each block increases, the power consumption of each block increases, the propagation delay time increases and the like, thereby deteriorating the performance of the LSI.

Furthermore, when the first method described above is employed to write and read out the test data, it is necessary to connect address and clock signal lines to each latch circuit, and the number of interconnections which must be connected to each block increases. That is, there is a need to widen the channel region for the

SUMMARY OF THE INVENTION

Accordingly, it is a general object of the present invention to provide a novel and useful testing method, a testing circuit and a semiconductor integrated circuit having the testing circuit in which the problems described above are eliminated.

Another and more specific object of the present invention is to provide a testing method of testing functions of a semiconductor integrated circuit which has a plurality of blocks each having a main block circuit part and an output part, which testing method comprises the steps of supplying a control signal to the output part of each of the blocks in a normal mode so that each output part outputs an output data of the main block circuit part of a corresponding one of the blocks, supplying the control signal and a test data to the output part of each of the blocks in a test mode so that each output part outputs the test data which is supplied to the main block circuit part of another block, and comparing the output data and the test data in the output part of each of the blocks in the test mode and outputting a failure detection signal which is indicative of a failure in a corresponding one of the blocks when the compared output data and test data do not match in the one block. According to the testing method of the present invention, there is no need to connect interconnections for use during the test mode. For this reason, it is possible to suppress the increase in the area which is occupied by the blocks as well as the power consumption. Furthermore, the propagation delay time is also reduced.

Still another object of the present invention is to provide a testing circuit in a semiconductor integrated circuit which has a plurality of blocks each having a main block circuit part and an output part, which testing circuit comprises means in the output part of each of the blocks for receiving a control signal in a normal mode and for outputting from each output part an output data of the main block circuit part of a corresponding one of the blocks, means in the output part of each of the blocks for receiving the control signal and a test data in a test mode and for outputting the test data from each output part to be supplied to the main block circuit part of another block, and means for comparing the output data and the test data in the output part of each of the blocks in the test mode and for outputting a failure detection signal which is indicative of a failure in a corresponding one of the blocks when the compared output data and test data do not match in the one block.

A further object of the present invention is to provide a semiconductor integrated circuit comprising a plurality of blocks each including a main block circuit part and an output part, means in the output part of each of the blocks for receiving a control signal in a normal mode and for outputting from each output part an output data of the main block circuit part of a corresponding one of the blocks, means in the output part of each of the blocks for receiving the control signal and a test data in a test mode and for outputting the test data from each output part to be supplied to the main block circuit part of another block, and means for comparing the output data and the test data in the output part of each of the blocks in the test mode and for outputting a failure detection signal which is indicative of a failure in a corresponding one of the blocks when the compared output data and test data do not match in the one block.

Other objects and further features of the present invention will be apparent from the following detailed description when read in conjunction with the accompanying drawings.

DESCRIPTION OF THE PREFERRED EMBODIMENTS

Figure 1:
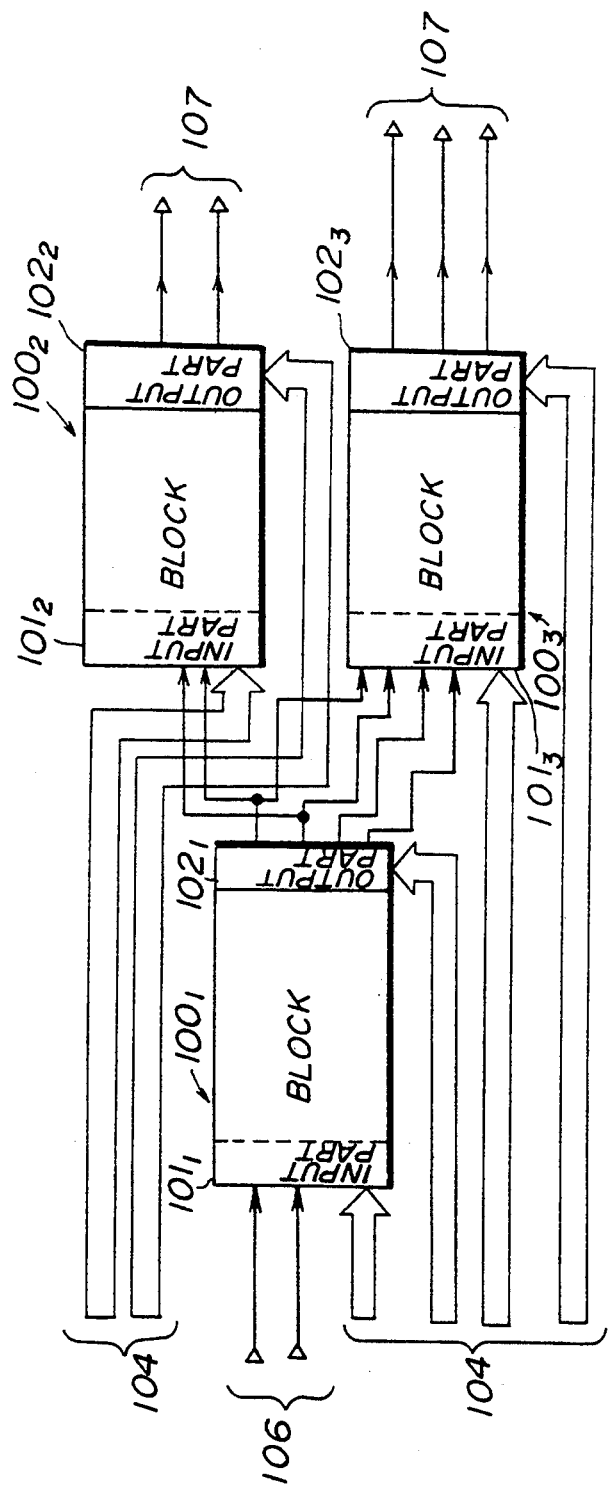
FIG. 1 schematically shows conventional interconnections between blocks when a first method is employed.
Figure 2:
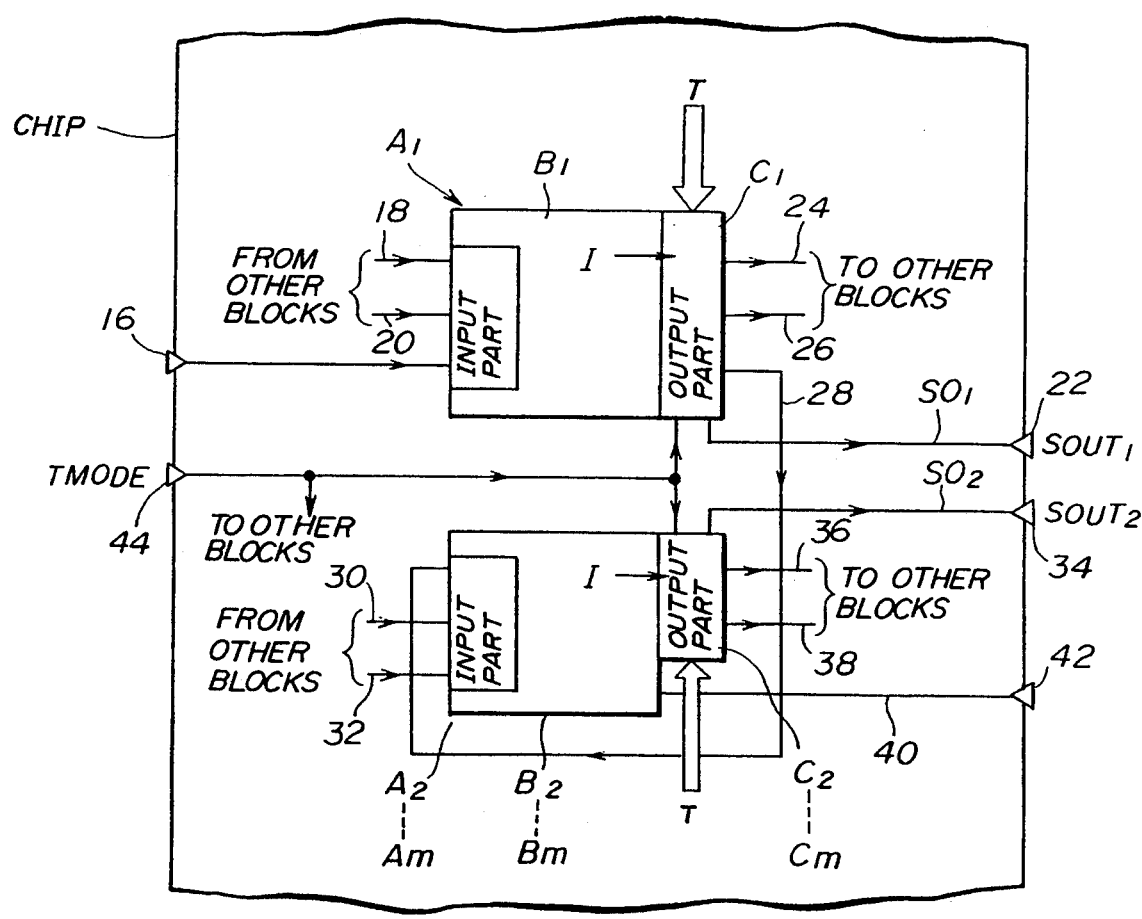
FIG. 2 is a circuit diagram showing an essential part of a semiconductor integrated circuit for explaining an embodiment of a testing method, a testing circuit and a semiconductor integrated circuit having the testing circuit according to the present invention.

FIG. 2 is a circuit diagram showing an essential part of a semiconductor integrated circuit for explaining an embodiment of a testing method, a testing circuit and a semiconductor integrated circuit having the testing circuit according to the present invention.

In FIG. 2, the semiconductor integrated circuit includes m blocks $A_1$ through $A_m$ which are all arranged within one chip. Each block $A_i$ has a main block circuit part $B_i$ and an output part $C_i$ which receives an output data I ($I_1$ through $I_n$) from the main block circuit part $B_i$ and outputs this output data I as it is in a normal mode, where i=1, ..., m.

An input terminal 16 of the chip is connected to the main block circuit part $B_1$ of the block $A_1$, and input signals 18 and 20 from other blocks are supplied to the main block circuit part $B_1$. An output terminal 22 of the chip is connected to the output part $C_1$ of the block $A_1$, and the output part $C_1$ supplies output signals 24, 26 and 28 to other blocks. For example, the output part $C_1$ of the block $A_1$ supplies the output signal 28 to the main block circuit part $B_2$ of the other block $B_2$. Similarly, input signals 30 and 32 from other blocks are supplied to the main block circuit part $B_2$ of the block $A_2$, and the output signal 28 from the output part $C_1$ of the other block $A_1$ is supplied to the main block circuit part $B_2$ of the block $A_2$. In addition, an output terminal 34 of the chip is connected to the output part $C_2$ of the block $A_2$, and the output part $C_2$ supplies output signals 36 and 38 to other blocks. An output signal 40 is supplied directly from the main block circuit part $B_2$ to an output terminal 42.

A TMODE terminal 44 is included in the input terminals of the chip. The operation mode of the output parts $C_1$ through $C_m$ of the blocks $A_1$ through $A_m$ are switched between the normal mode and a test mode depending on a control signal TM which is received from the TMODE terminal 44.

First, when the output parts $C_1$ through $C_m$ are set to the normal mode, each output part $C_i$ outputs the output data I ($I_1$ through $I_n$) of the corresponding main block circuit part $B_i$ as it is.

On the other hand, when the output parts $C_1$ through $C_m$ are set to the test mode, each output part $C_i$ receives a test data T ($T_1$ through $T_n$) and each output part $C_i$ outputs the test data T. In addition, each output part $C_i$ compares the test data T and the output data I from the corresponding main block circuit part $B_i$ and outputs a failure detection signal $SO_i$ when the two do not match. The failure detection signals $SO_1$ through $SO_m$ output from the output parts $C_1$ through $C_m$ are output via the output terminals 22, 34 and the like.

In the semiconductor integrated circuit shown in FIG. 2, all of the inputs of each block $A_i$ are connected to the input terminals of the chip or to the outputs of other blocks, and the blocks $A_1$ through $A_m$ are mutually independent. Accordingly, when the output parts $C_1$ through $C_m$ are set to the test mode, it is possible to test only the block of interest regardless of whether or not a failure exists in other blocks. Furthermore, when a failure is detected in the block $A_j$ of interest, the failure detection signal $SO_j$ is output from the output terminal 22, 34 or the like so that it is possible to accurately detect the block in which the failure exists.

Normally, latch circuits or flip-flops are used to write and read out the test data T. As methods of writing and reading the test data, there basically are two methods. According to the first method, scan-in and scan-out functions are provided in each latch circuit and the test data is selectively written and read out based on the scan address. On the other hand, according to the second method, a shift register is formed by connecting the flip-flops in series and the test data is written and read out by a shift operation of the shift register.

Figure 3:
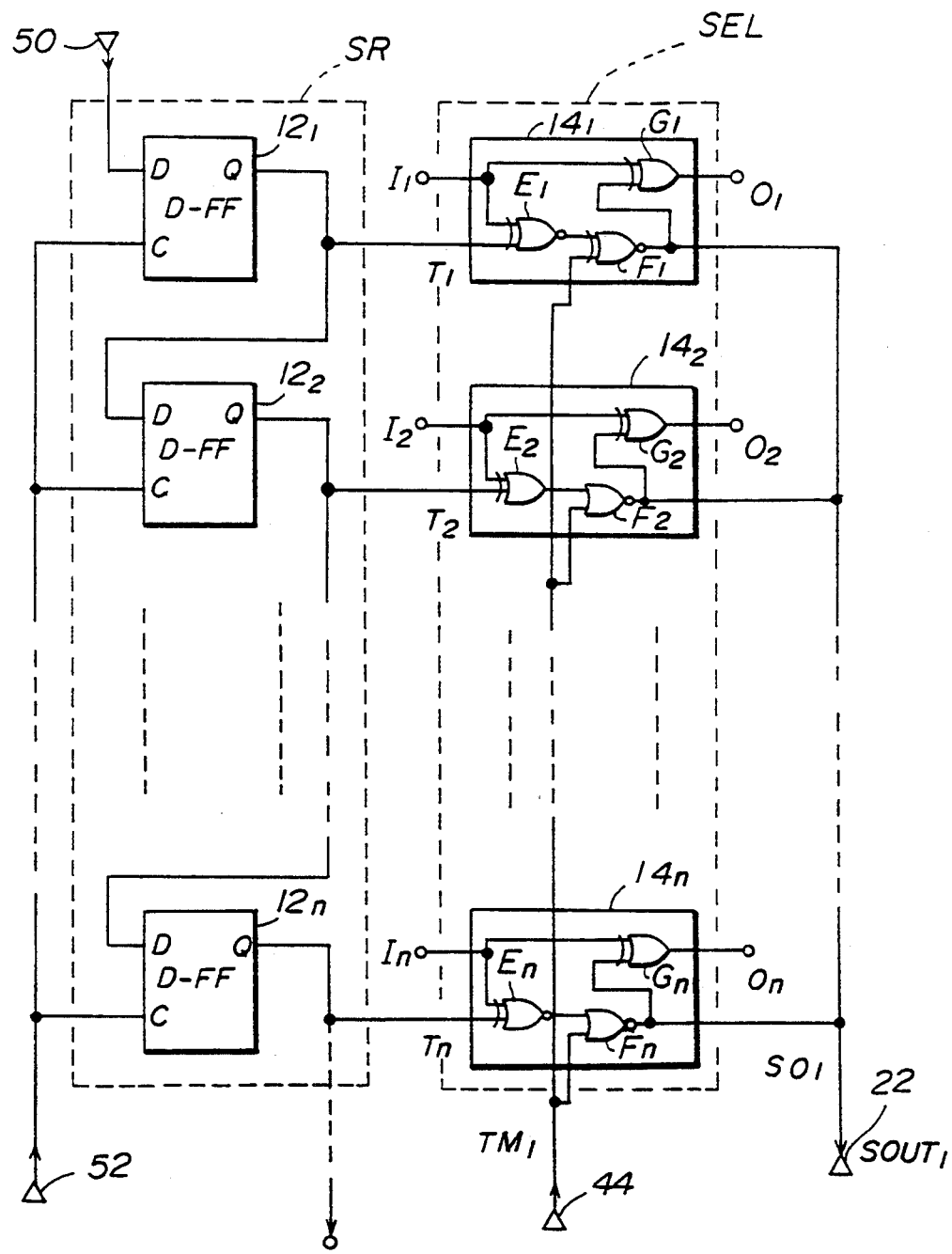
FIG. 3 is a circuit diagram showing an embodiment of an output part of one block shown in FIG. 2.

For the sake of convenience, a description will first be given of a case where the second method is employed to write and read out the test data. FIG. 3 shows the structure of the output part $C_1$ as one embodiment of the output parts $C_1$ through $C_m$ of the blocks $A_1$ through $A_m$.

In FIG. 3, the output part $C_1$ has a shift register part SR and a selector part SEL. The shift register part SR includes a plurality of D flip-flops $12_1$ through $12_n$ which are connected in series. A scan data from a scan data input terminal 50 of the chip is supplied to a data input terminal D of the flip-flop $12_1$. A scan clock from a scan clock input terminal 52 of the chip is supplied to a clock input terminal C of each of the flip-flops $12_1$ through $12_n$. The data output from the output terminals D of the flip-flops $12_1$ through $12_n$ are supplied to the selector part SEL as the test data $T_1$ through $T_n$.

The selector part SEL has a plurality of selectors $14_1$ through $14_n$, and each selector $14_k$ includes elements E1 through En, elements G1 through Gn and elements F1 through Fn, where $k=1, \ldots, n$. The elements E1 through En respectively obtain an inverse (NOT) of an exclusive-OR. The elements F1 through Fn respectively obtain an inverse (NOT) of a logical sum (OR). The elements G1 through Gn respectively obtain an exclusive-OR. The output data $I_1$ through $I_n$ from the main block circuit part $B_1$ are supplied to the corresponding elements E1 through En and the corresponding elements G1 through Gn. In additions output data $O_1$ through $O_n$ from the elements G1 through Gn are output as outputs of the selectors $14_1$ through $14_n$. A logical sum of outputs of the elements F1 through Fn are obtained by a wired-OR, and a failure detection signal $SO_1$ is output to the SOUT1 terminal 22. In addition, the elements F1 through Fn receive the control signal $TM_1$ from the TMODE terminal 44, and the operation mode of the selectors $14_1$ through $14_n$ are set to the normal mode or the test mode.

As systems of generating the test data $T_1$ through $T_n$, there is a first system in which the shift register parts SR of the output parts $C_1$ through $C_m$ of the blocks $A_1$ through $A_m$ are connected in series to form one shift register, and a second system in which one shift register is formed for every shift register part SR of each of the output parts $C_1$ through $C_m$ of the blocks $A_1$ through $A_m$.

Figure 4:
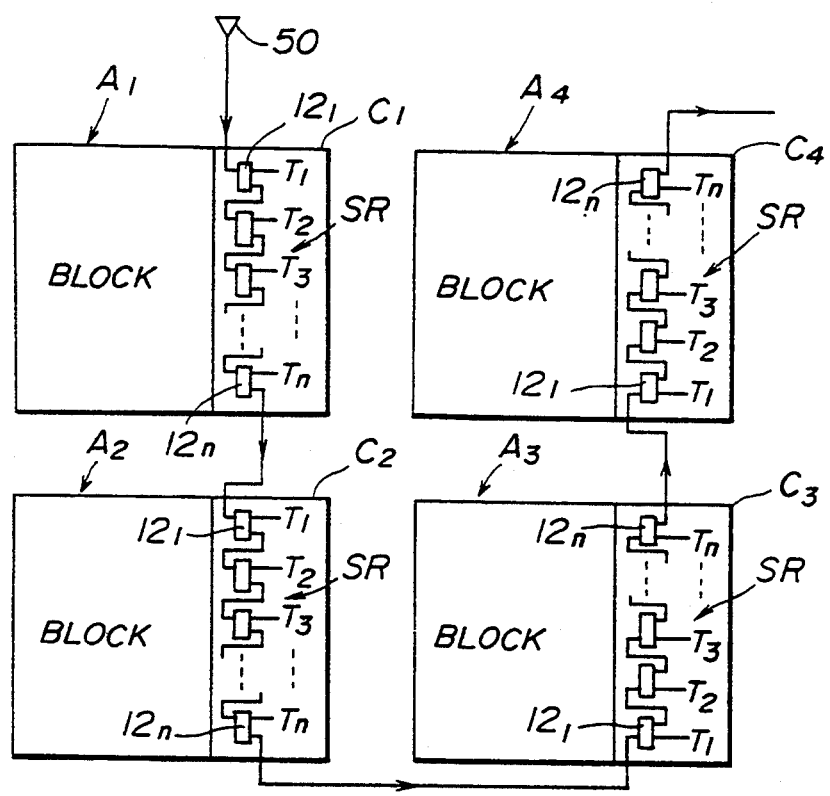
FIG. 4 generally shows connections of a shift register when a first system is employed.

FIG. 4 generally shows the connection of the shift register parts SR for four blocks $A_1$ through $A_4$ when the first system is employed. In this case, $i = 1, 2$ and 3 and the output terminal Q of the flip-flop $12_n$ of the shift register part SR in the output part $C_i$ is connected to the data input terminal D of the flip-flop $12_1$ of the shift register part SR in the output part $C_{i+1}$.

Figure 5:
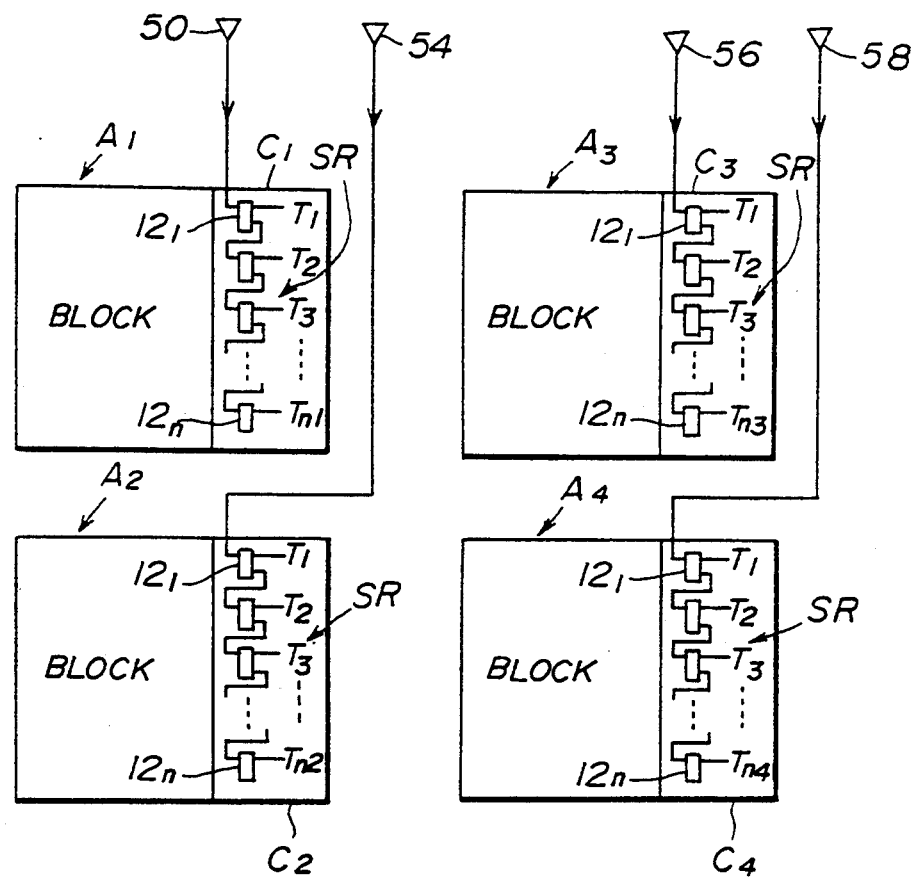
FIG. 5 generally shows connections of a shift register when a second system is employed.

FIG. 5 generally shows the connection of the shift register parts SR for four blocks $A_1$ through $A_4$ when the second system is employed. In this case, the data input terminals D of the flip-flops $12_1$ of the shift register parts SR in the output parts $C_1$ through $C_4$ are respectively connected to input terminals 50, 54, 56 and 58. When the input terminals 50, 54, 56 and 58 are independently provided with respect to each of the blocks $A_1$ through $A_4$, the number of pins of the chip becomes large. For this reason, it is possible to provide an input switching circuit (not shown) within the chip so that the input terminals 50, 54, 56 and 58 become the input terminals for the scan data only during the test mode and become the input terminals for other data during the normal mode, that is, multiple uses are assigned to the input terminals.

Returning to the description of the operation of the output part $C_1$ shown in FIG. 3, a high-level control signal $TM_1$ is supplied from the TMODE terminal 44 to the selectors $14_1$ through $14_n$ of the selector part SEL in the normal mode. For this reason, one input to each of the elements F1 through Fn has a high level, and a low-level output is obtained from the elements F1 through Fn regardless of whether the other input to each of the elements F1 through Fn has a high level or a low level. Accordingly, one input to each of the elements G1 through Gn has a low level, and the other input to each of the elements G1 through Gn, that is, the output data $I_1$ through $I_n$ of the main block circuit part $B_1$ are output as they are as the output data $O_1$ through $O_n$.

On the other hand, the control signal $TM_1$ from the TMODE terminal 44 has a low level in the test mode. Hence, one input to each of the elements F1 through Fn has a low level. When the output data $I_1$ through $I_n$ match the corresponding test data $T_1$ through $T_n$, that is, when the output data $I_1$ through $I_n$ and the test data $T_1$ through $T_n$ both have the high level or the low level, high-level signals are output from the elements E1 through En and low-level signals are output from the elements F1 through Fn. Thus, one input to each of the elements G1 through Gn has a low level, and the test data $T_1$ through $T_n$ are output from the elements G1 through Gn as the output data $O_1$ through $O_n$. In addition, because the low-level signals are output from the elements F1 through Fn, the failure detection signal $SO_1$ has a low level. Therefore, the low-level failure detection signal $SO_1$ indicates that no failure exists in the block $A_1$.

On the other hand, when the output data $I_1$ and the test data $T_1$ do not match, for example, that is, when the output data $I_1$ has a high level and the test data $T_1$ has a low level or vice versa, a low-level signal is output from the element E1 and a high-level signal is output from the element F1. Accordingly, one input to the element G1 has a high level, the output data $I_1$ is inverted and the test data $T_1$ is output as the output data $O_1$. In addition, because the high-level signal is output from the element F1, the failure detection signal $SO_1$ has a high level. Therefore, the high-level failure detection signal $SO_1$ indicates that a failure exists in the block $A_l$.

As described above, it is possible to discriminate whether or not a failure exists in the block $A_1$ from the level of the failure detection signal $SO_1$, that is, whether the failure detection signal $SO_1$ has a high level or a low level.

The output terminals (SOUT) for the failure detection signals $SO_1$ through $SO_m$ may be provided for each of the blocks $A_1$ through $A_m$ as shown in FIG. 2, or may be used in common for the blocks $A_1$ through $A_m$ by providing a selector (not shown) or the like. In addition, when there is no need to detect the failure for each of the blocks $A_1$ through $A_m$, it is possible to obtain a logical sum of the failure detection signals $SO_1$ through $SO_m$ by a wired-OR and output a single failure detection signal from one output terminal (SOUT) of the chip.

Figure 6:
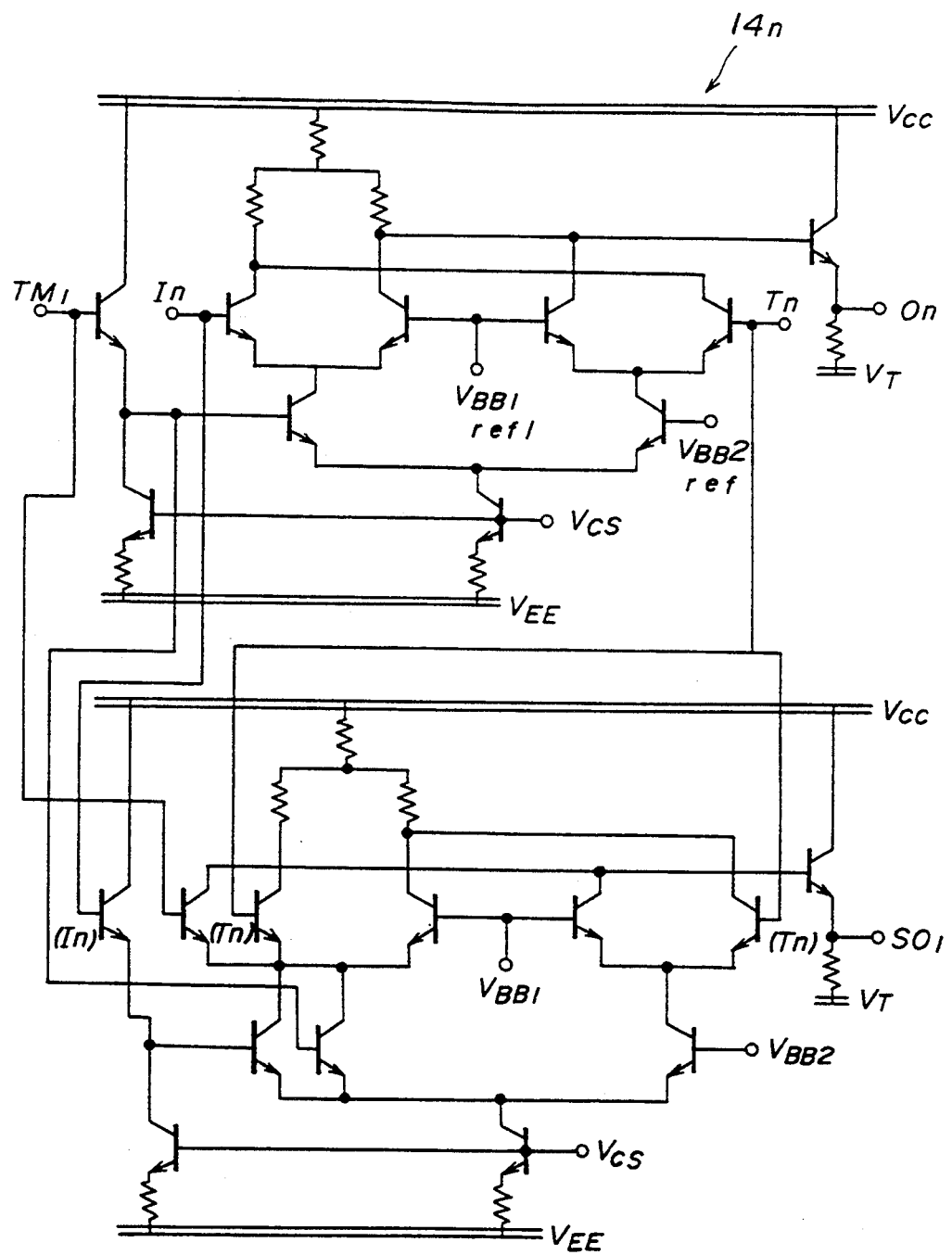
FIG. 6 is a circuit diagram showing a selector of the output part shown in FIG. 3.

FIG. 6 shows the circuit structure of the selector $14_n$ of the output part $C_1$ shown in FIG. 3 when the selector $14_n$ is formed by an emitter coupled logic (ECL) circuit having two stages of series connected gates.

In the above described embodiment, the chip includes m blocks $A_1$ through $A_m$. However, the embodiment is similarly applicable to a chip which includes only one block, and in such a case, the failure of the block can be detected similarly to detect the failure of the chip.

When the second method is employed to write the test data T, there is no need to provide flip-flops for the test within an input part of each block and it is possible to reduce the length of the shift register part. In addition, since there is no need to read out the test data, it is possible to reduce test time by considerably reducing the time it takes to write and read out the test data. Further, in the semiconductor integrated circuit which includes a large number of blocks, it is possible to efficiently discriminate the existence of failure for each block.

Figure 7:
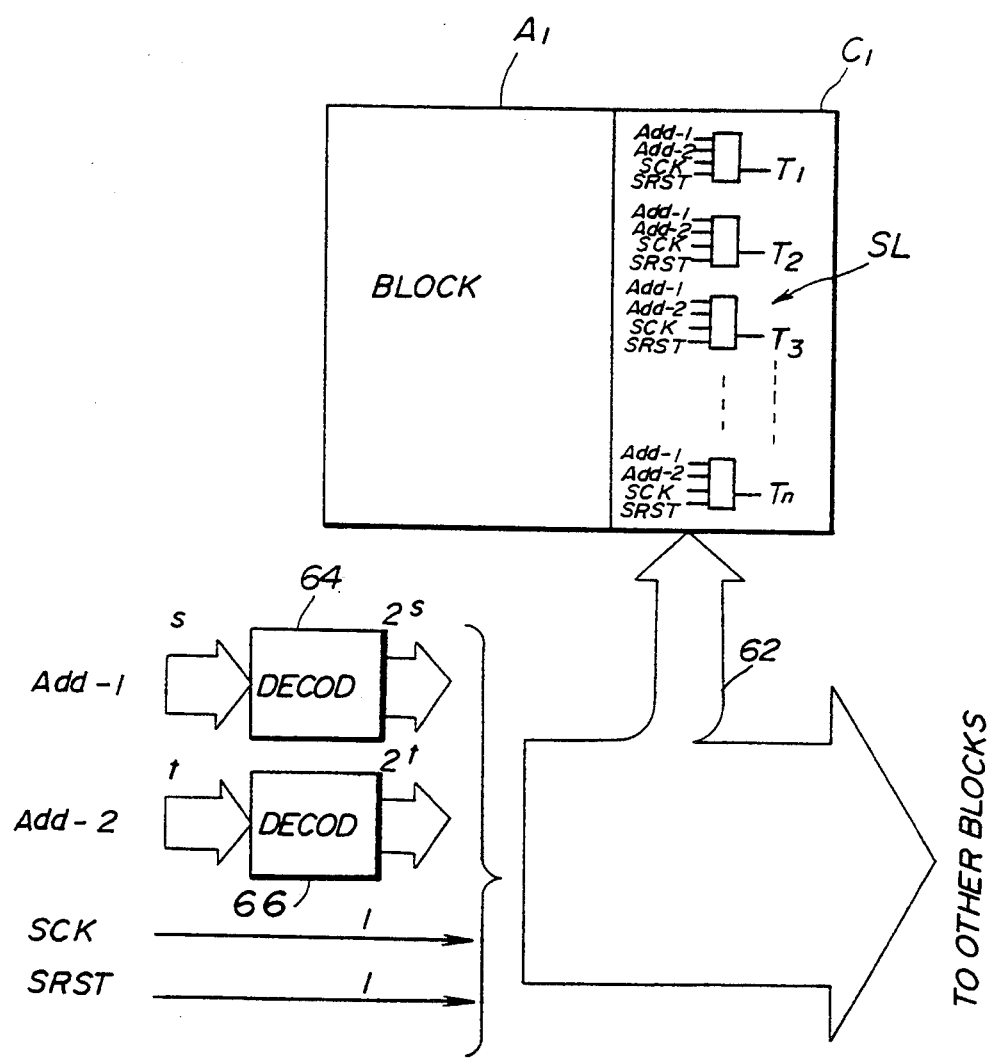
FIG. 7 is a system block diagram showing an embodiment of one block shown in FIG. 2.

Next, a description will be given of a case where the first method is employed to write the test data T. FIG. 7 shows an embodiment of the block $A_1$ shown in FIG. 2, and FIG. 8 shows the circuit structure of the output part $C_1$ of the block $A_1$ shown in FIG. 7.

In FIG. 7, a test bus 62 is connected to the output part $C_1$ of the block $A_1$. The test bus 62 includes address lines, a clock signal line and a reset signal line. The address lines receive an address ($2^s$ address locations) which is obtained by decoding an s-bit scan address Add-1 in a decoder 64 and an address ($2^t$ address locations) which is obtained by decoding a t-bit scan address Add-2 in a decoder 66. These scan addresses Add-1 and Add-2 may be supplied from outside the chip via input terminals to which multiple uses are assigned, or may be generated from an address generating circuit (not shown) which is provided within the chip. A 1-bit scan clock SCK is supplied to the clock signal line, and a 1-bit scan reset signal SRST is supplied to the reset signal line.

Figure 8:
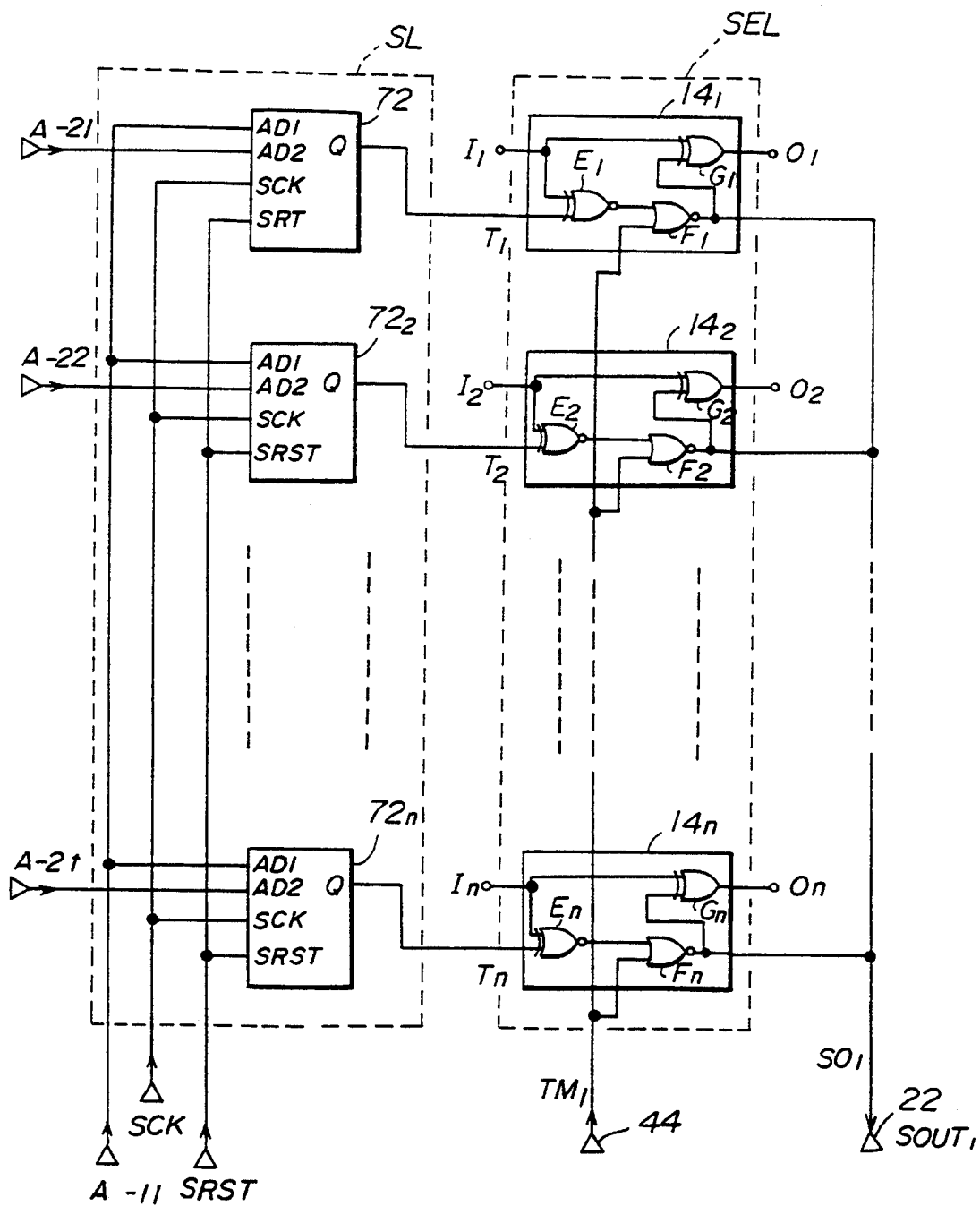
FIG. 8 is a circuit diagram showing an embodiment of an output part of the block shown in FIG. 7.

In FIG. 8, those parts which are the same as those corresponding parts in FIG. 3 are designated by the same reference numerals, and a description thereof will be omitted. In FIG. 8, the output part $C_1$ has a scan latch part SL and the selector part SEL. The scan latch part SL includes a plurality of latch circuits $72_1$ through $72_n$. A bit A-11 of the scan address Add-1 is supplied to address input terminals AD1 of each of the latch circuits $72_1$ through $72_n$. In addition, bits A-21 through A-2n of the scan address Add-1 are supplied to address input terminals AD2 of the corresponding latch circuits $72_1$ through $72_n$. The scan clock SCK and the scan reset signal SRST are respectively supplied to a clock input terminal SCK and a reset terminal SRST of each of the latch circuits $72_1$ through $72_n$. Outputs from output terminals Q of the latch circuits $72_1$ through $72_n$ are supplied to the selector part SEL as the test data $T_1$ through $T_n$.

Figure 9:
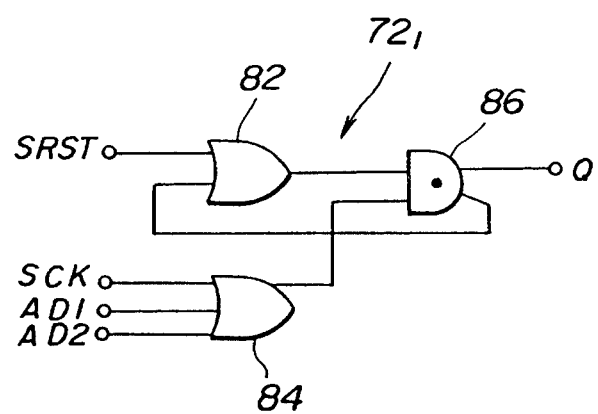
FIG. 9 is a circuit diagram showing an embodiment of a latch circuit shown in FIG. 8.

FIG. 9 shows the circuit structure of the latch circuit $72_1$ as an embodiment of the latch circuits $72_1$ through $72_n$. In FIG. 9, the latch circuit $72_1$ includes OR circuits 82 and 84 and an AND circuit 86. The scan reset signal SRST and an output signal of the AND circuit 86 are supplied to the OR circuit 82. The scan clock SCK and the scan address bits A-11 and A-21 are supplied to the OR circuit 84. An output signal of the AND circuit 86 is output from the output terminal Q as the output of the latch circuit $72_1$.

Figure 10:
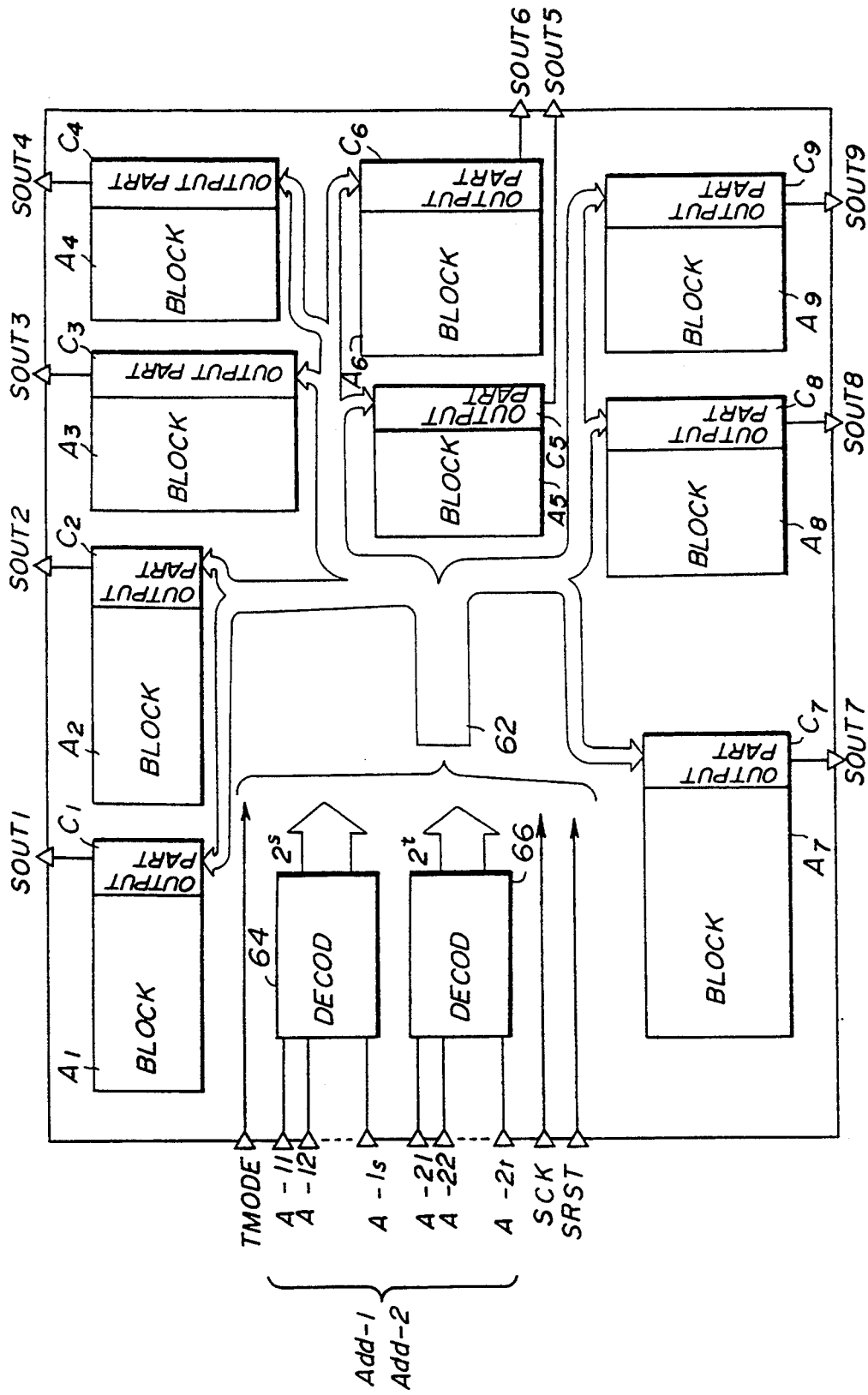
FIG. 10 is a diagram showing an embodiment of an arrangement of blocks on a chip.

FIG. 10 shows an embodiment of the arrangement of the blocks on the chip when nine blocks are provided. In FIG. 10, those parts which are the same as those corresponding parts in FIGS.2 and 7 are designated by the same reference numerals, and a description thereof will be omitted. In addition, the illustration of the normal interconnections between the blocks is omitted in FIG. 10 for the sake of convenience.

When the first method is employed to write and read out the test data T as described above, it is necessary to connect to the output parts of each of the blocks the test bus (interconnections for the test) which includes the address line, the clock signal line and the like. However, no interconnections for the test need to be connected to the input parts of each of the blocks. For this reason, it is possible to suppress the decrease in the integration density which would be caused by a widening of the interconnections between the blocks in the channel region. In addition, in the semiconductor integrated circuit which includes a large number of blocks, it is possible to efficiently discriminate the existence of the failure for each block.

Further, the present invention is not limited to these embodiments, but various variations and modifications may be made without departing from the scope of the present invention.

What is claimed is:

1. A testing method of testing functions of a semiconductor integrated circuit which has a plurality of blocks each having a main block circuit part and an output part, the plurality of blocks including a first block and a second block, the output part of the first block being electrically connected to the main block circuit part of the second block, said testing method comprising the steps of:

supplying a control signal to the output part of each of the first and second blocks in a normal mode so that the output part of the first block outputs first output data of the main block circuit part of the first block to the main block circuit part of the second block and so that the output part of the second block outputs second output data of the main block circuit part of the second block;

supplying the control signal and first test data to the output part of the first block in a test mode so that the main block circuit part of the first block outputs first test output data and so that the output part of the first block outputs the first test data to the main block circuit part of the second block;

supplying the control signal and second test data to the output part of the second block in the test mode so that the main block circuit part of the second block outputs second test output data and so that the output part of the second block outputs the second test data to the main block circuit part of another block;

supplying, in the test mode, first test output data from the main block circuit part of the first block to the output part of the first block and second test output data from the main block circuit part of the second block to the output part of the second block;

comparing the first test output data and the first test data in the output part of the first block in the test mode and outputting a first failure detection signal which is indicative of a failure in the first block when the compared first output data and first test data do not match in the first block; and comparing the second test output data and the second test data in the output part of the second block in the test mode and outputting a second failure detection signal which is indicative of a failure in the second block when the compared second output data and second test data do not match in the second block.

2. The testing method as claimed in claim 1 wherein each of said output parts includes a shift register, said first test data is supplied to the shift register of the output part of the first block, and the shift registers of the output parts of the second and subsequent blocks are respectively supplied with the second and subsequent test data including an output of the shift register of the output part in a previous block.

3. The testing method as claimed in claim 1 wherein each of said output parts include a shift register, and said first and second test data are independently supplied to the shift register of the output parts of the first and second blocks, respectively.

4. The testing method as claimed in claim 1 wherein a scan address is supplied to the output part of each of the first and second blocks to designate an output part which is to be tested.

5. A testing circuit in a semiconductor integrated circuit which has a plurality of blocks each having a main block circuit part and an output part, the plurality of blocks including a first block and a second block, the output part of the first block being electrically connected to the main block circuit part of the second block, said testing circuit comprising:

means in the output part of each of the first and second blocks for receiving a control signal and for switching between a normal mode and a test mode based on the control signal;

means in the output part of the first block for receiving first test data;

means in the output part of the second block for receiving second test data;

means in the output part of the first block for outputting from the output part of the first block, when in the normal mode, first output data of the main block circuit part of the first block to the main block circuit part of the second block and for outputting when in the test mode, the first test data from the output part of the first block to the main block circuit part of the second block and first test output data from the main block circuit part of the first block to the output part of the first block;

means in the output part of the second block for outputting from the output part of the second block, when in the normal mode, second output data of the main block circuit part of the second block and for outputting, when in the test mode, the second test data from the output part of the second block to the main block circuit part of another block and second test output data from the main block circuit part of the second block to the output part of the second block;

means for comparing the first test output data and the first test data in the output part of the first block in the test mode and for outputting a first failure detection signal which is indicative of a failure in the first block when the compared first test output data and first test data do not match in the first block; and means for comparing the second test output data and the second test data in the output part of the second block in the test mode and for outputting a second failure detection signal which is indicative of a failure in the second block when the compared second test output data and second test data do not match in the second block.

6. The testing circuit as claimed in claim 5 wherein each of said output parts includes a shift register, said first test data is supplied to the shift register of the output part of the first block, and the shift registers of the output parts of the second and subsequent blocks are respectively supplied with the second and subsequent test data including an output of the shift register of the output part in a previous block.

7. The testing circuit as claimed in claim 5 wherein each of said output parts includes a shift register, and said first and second test data are independently supplied to the shift register of the output parts of the first and second blocks, respectively.

8. The testing circuit as claimed in claim 5 wherein a scan address is supplied to the output part of each of the first and second blocks to designate an output part which is to be tested.

9. A semiconductor integrated circuit comprising:

a plurality of blocks each including a main block circuit part and an output part, the plurality of blocks including a first block and a second block, the output part of the first block being electrically connected to the main block circuit part of the second block;

means in the output part of each of the first and second blocks for receiving a control signal and for switching between a normal mode and a test mode based on the control signal;

means in the output part of the first block for receiving first test data;

means in the output part of the second block for receiving second test data;

means in the output part of the first block for outputting from the output part of the first block, when in the normal mode, first output data of the main block circuit part of the first block to the main block circuit part of the second block and outputting, when in the test mode, the first test data from the output part of the first block to the main block circuit part of the second block and first test output data from the main block circuit part of the first block to the output part of the first block;

means in the output part of the second block for outputting from the output part of the second block, when in the normal mode, second output data of the main block circuit part of the second block and for outputting, when in the test mode, the second test data from the output part of the second block to the main block circuit part of another block and second test output data from the main block circuit part of the second block to the output part of the second block;

means for comparing the first output data and the first test data in the output part of the first block in the test mode and for outputting a first failure detection signal which is indicative of a failure in the first block when the compared first output data and first test data do not match in the first block; and means for comparing the second output data and the second test data in the output part of the second block in the test mode and for outputting a second failure detection signal which is indicative of a failure in the second block when the compared second output data and second test data do not match in the second block.

10. The semiconductor integrated circuit as claimed in claim 9 wherein said first test data is supplied to the output part of a first block, and the output parts of the second and subsequent blocks are respectively supplied with the second and subsequent test data including an output of the output part of a previous block.

11. The semiconductor integrated circuit as claimed in claim 10 wherein each output part of the first and second blocks includes i) a shift register part which respectively receive the first and second test data and ii) a selector part which respectively receive the first and second output data and respectively receive the first and second test data via the corresponding shift register part.

12. The semiconductor integrated circuit as claimed in claim 11 wherein said shift register part comprises a plurality of flip-flops which are connected in series.

13. The semiconductor integrated circuit as claimed in claim 9 wherein said first and second test data are independently supplied to the output parts of the first and second blocks, respectively.

14. The semiconductor integrated circuit as claimed in claim 13 wherein each output part of the first and second blocks includes i) a shift register part which respectively receive the first and second test data and ii) a selector part which respectively receive the first and second output data and respectively receive the first and second test data via the corresponding shift register part.

15. The semiconductor integrated circuit as claimed in claim 14 wherein said shift register part comprises a plurality of flip-flops which are connected in series.

16. The semiconductor integrated circuit as claimed in claim 9 wherein a scan address is supplied to the output part of each of the first and second blocks to designate an output part which is to be tested.

17. The semiconductor integrated circuit as claimed in claim 16 wherein each output part of the first and second blocks includes i) a scan latch part which receives the scan address together with a scan clock signal, and ii) a selector part which respectively receive the first and second output data and respectively receive an output of the scan latch part as the first and second test data.

18. The semiconductor integrated circuit as claimed in claim 17 wherein said scan latch part comprises a plurality of latch circuits for receiving corresponding bits of the scan address and the scan clock signal.

19. The semiconductor integrated circuit as claimed in claim 9 which further comprises interconnections associated with the test mode, said interconnections being only connected to the output part of each of the first and second blocks.

* * * * *

UNITED STATES PATENT AND TRADEMARK OFFICE
CERTIFICATE OF CORRECTION

PATENT NO. : 5,384,533
DATED : January 24, 1995
INVENTOR(S) : Hideo TOKUDA, et al.

It is certified that error appears in the above-indentified patent and that said Letters Patent is hereby corrected as shown below:

Column 5

Line 18, "additions" should be --addition,--.

Column 10

Line 25, after "and" insert --for--.

Signed and Sealed this

Eighteenth Day of April, 1995

BRUCE LEHMAN

*Commissioner of Patents and Trademarks*

*Attest:*

*Attesting Officer*